United States Patent
Thalmann

(10) Patent No.: US 7,188,291 B2
(45) Date of Patent: Mar. 6, 2007

(54) CIRCUIT AND METHOD FOR TESTING A CIRCUIT HAVING MEMORY ARRAY AND ADDRESSING AND CONTROL UNIT

(75) Inventor: Erwin Thalmann, Villach (AT)

(73) Assignee: Infineon Technologies AG, Muenchen (DE)

( * ) Notice: Subject to any disclaimer, the term of this patent is extended or adjusted under 35 U.S.C. 154(b) by 261 days.

(21) Appl. No.: 10/889,923

(22) Filed: Jul. 12, 2004

(65) Prior Publication Data
US 2005/0010844 A1    Jan. 13, 2005

(30) Foreign Application Priority Data
Jul. 11, 2003 (DE) ................. 103 31 543

(51) Int. Cl.
*G01R 31/28* (2006.01)
*G11C 29/00* (2006.01)

(52) U.S. Cl. ............................ 714/736; 365/201

(58) Field of Classification Search ........ 714/733–736, 714/724; 365/200–201
See application file for complete search history.

(56) References Cited

U.S. PATENT DOCUMENTS

| | | | |
|---|---|---|---|
| 5,899,961 A * | 5/1999 | Sundermann | 702/117 |
| 6,144,595 A * | 11/2000 | Hirooka et al. | 365/201 |
| 6,154,861 A | 11/2000 | Harward | 714/719 |
| 6,178,532 B1 * | 1/2001 | Pierce et al. | 714/718 |
| 6,484,278 B1 * | 11/2002 | Merritt et al. | 714/719 |
| 6,536,004 B2 * | 3/2003 | Pierce et al. | 714/719 |

\* cited by examiner

*Primary Examiner*—Cynthia Britt
(74) *Attorney, Agent, or Firm*—Laurence A. Greenberg; Werner H. Stemer; Ralph E. Locher

(57) ABSTRACT

A circuit configuration for testing a circuit using a test device for providing a test mode, where test procedures are performed sequentially. The test procedures involve comparing actual data that are output by the circuit under test with prescribed nominal data in the test device. A combinational logic device for logically combining the sequentially output test results is provided such that result data indicate fault free operation of the circuit under test only if the actual data which are output match the prescribed nominal data in all of the sequentially performed test procedures. The result data is output via an addressing and control unit in the circuit under test.

15 Claims, 2 Drawing Sheets

CIRCUIT AND METHOD FOR TESTING A CIRCUIT HAVING MEMORY ARRAY AND ADDRESSING AND CONTROL UNIT

BACKGROUND OF THE INVENTION

Field of the Invention

The invention relates generally to a method for testing electronic circuits which have at least one memory cell array and at least one addressing and control unit. The invention further relates to a circuit configuration for carrying out the method using the terminals provided on the circuit configuration.

There is an increasing need to perform test procedures to a large extent in parallel and at low cost. The circuits under test relate above all to memory chips of increasing complexity. In this context, the test costs are determined essentially by the test time and are obtained from the number of circuits under test that can be tested in a prescribed time.

The number of testable circuits per unit time is also called the throughput rate. So that the costs per circuit under test can be lowered overall, it has been proposed that either the test times be reduced or the number of circuits to be tested in parallel per test system be increased.

Disadvantageously, it is necessary to connect the circuit under test to a test device using multiple test data lines in order to send appropriate test data to the circuit under test and to compare the actual data which are output by the circuit under test on the basis of the supplied test data with prescribed nominal data in the test device. To connect the test device to the circuit under test, conventional systems use test data lines which contain four, eight or sixteen individual lines, for example. This large number of individual lines disadvantageously increases the test costs and the involvement for connecting a circuit that is under test.

To solve this problem, proposals have already been made to use a special test mode which allows the circuit under test to be tested using a single test data line. In such a test mode, the data expected (nominal data) and the data read (actual data) are compared directly on a chip that also holds the circuit under test. Next, only that information item which indicates that the circuit tested is faulty or that the circuit tested is correct, is now output via the single test data line output via the single test data line. The information content of the test result is thus available on a single terminal unit in the test device.

This test mode is called an advanced compression test mode (ACTM). However, there is still the drawback that even the use of the ACTM requires the provision of a dedicated terminal unit for outputting the test result. Inexpediently, this single terminal unit is needed only for testing the circuit under test and is not required for operating the circuit. Therefore, the test and operating costs for the circuit under test are unnecessarily high.

The terminal unit of the test device provided for outputting the test result is used merely to transfer the test result and otherwise has no other function.

FIG. 2 shows a conventional circuit configuration for testing a circuit 100 under test. Together with the circuit 100 under test, a test device 200 is disposed on a single chip.

Data communication between the circuit 100 under test and the test device 200 is provided by a test data line 104 that contains four, eight or sixteen individual lines, for example. Conventionally, a test mode unit 201 in the test device 200 outputs test data 105 to a data unit 103 in the circuit 100 under test. The data are transmitted from the data unit 103 to a memory cell array 101 in the circuit 100 that is under test. The memory cell array 101 in the circuit 100 under test is actuated by an addressing and control unit 102 using addressing and control data 107.

The addressing and control data 107 are supplied via an addressing and control line 106 and an addressing and control terminal unit 108. The actual data 105a returned on the basis of the test data 105 supplied to the circuit 100 under test are compared with prescribed nominal data in the test device 200. As the result of the comparison, a test result 203 is output onto a result data line 202 via a terminal 204 in the test device.

A fundamental drawback of the conventional circuit configuration for testing circuits under test is thus that, besides the addressing and control terminal 108 for actuating the memory cell array 101 in the circuit 100 under test, there needs to be the terminal 204 in the test device 200 which is provided merely for test purposes. The additional connection pin inexpediently increases the costs for the circuit under test and the overall costs for a test. In addition, the conventional circuit configuration does not permit parallel testing to any great extent.

SUMMARY OF THE INVENTION

It is accordingly an object of the invention to provide a method for testing a circuit which is under test, and a circuit configuration for carrying out the method which overcomes the above-mentioned disadvantages of the prior art methods and devices of this general type, which avoid providing the test device with a terminal which is required exclusively for testing.

With the foregoing and other objects in view there is provided, in accordance with the invention, a circuit configuration for testing a circuit under test. The circuit has at least one memory cell array and at least one addressing and control unit. The circuit configuration contains a test data line connected to the circuit under test, and a test device for providing a test mode and is connected to the test data line. The test device has a test mode unit for producing test data supplied to the circuit under test through the test data line. The test device performs test procedures sequentially, the test procedures involving actual data output by the circuit under test on a basis of the test data and the actual data is compared with prescribed nominal data in the test mode unit. A result data line is provided for sequentially outputting test results obtained using the test procedures on a basis of the comparison. A combinational logic device is provided for logically combining the test results output sequentially to produce result data such that the result data indicate fault free operation of the circuit under test only if the actual data being output match the prescribed nominal data in all of the sequentially performed test procedures. The result data is only output by the addressing and control unit of the circuit under test.

It is the fundamental concept of the invention to logically combine the data which are read via a terminal in the test device and to store just a single test result for each circuit under test in a result memory unit, the test result stored in the result memory unit being output via addressing and control terminals which are provided by the circuit under test.

One advantage in this context is that test costs can be reduced to a significant extent, since an additional terminal pin is saved and it is possible to increase parallelism. The advantage of saving an additional pin (chip channel), which is no longer required for testing, is that parallelism in the testing is prescribed by the total number of tester channels for each of the chip channels required, i.e. the fewer chip channels required the greater the parallelism.

A higher level of parallelism results in a higher throughput rate and advantageously results in lower test costs.

Advantageously, the inventive circuit configuration allows a chip (a circuit board which is under test) to be tested merely using its addressing and control lines. The inventive method for testing circuits under test thus involves:
(i) storing a test result in a test device for the circuit under test;
(ii) accumulating the test results in the circuit under test; and
(iii) outputting the overall result via addressing and control lines.

The inventive circuit configuration for testing a circuit which is under test, where the circuit under test includes at least one memory cell array and at least one addressing and control unit, has:
a) a test device for providing a test mode, where the test device has a test mode unit for producing test data which are supplied to the circuit under test via a test data line, and test procedures are performed sequentially, the test procedures involving actual data which are output by the circuit under test on the basis of the test data being compared with prescribed nominal data in the test mode unit; and
b) a result data line for sequentially outputting test results obtained using the test procedures on the basis of the comparison, where a combinational logic device is provided for logically combining the sequentially output test results to produce result data, such that the result data indicate correct operation of the circuit under test only if the actual data which are output match the prescribed nominal data in all of the sequentially performed test procedures, and the result data are output via an addressing and control unit in the circuit under test.

In addition, the inventive method for testing a circuit that is under test has the following steps:
a) a test mode is provided using a test device;
b) test data are produced in a test mode unit in the test device;
c) the test data are supplied from the test device to the circuit under test via a test data line;
d) test procedures are performed sequentially, the test procedures involving actual data which are output by the circuit under test on the basis of the test data being compared with prescribed nominal data in the test mode unit; and
e) test results obtained using the test procedures on the basis of the comparison are output sequentially via a result data line, where the sequentially output test results are logically combined to produce result data using a combinational logic device such that the result data indicate fault free operation of the circuit under test only if the actual data which are output match the prescribed nominal data in all of the sequentially performed test procedures, and the result data are output via the addressing and control unit in the circuit under test.

In line with one preferred development of the present invention, the combinational logic device has a result memory unit for storing the sequentially obtained test results. Advantageously, only the accumulated result is stored in each case, i.e. the determination of a correct circuit under test, in which case the test procedure is continued, or the occurrence of an error during a performed test, in which case the circuit under test is determined to be faulty and the test can then be aborted.

In line with another preferred development of the present invention, the combinational logic device has of a control logic unit for updating the result memory unit. The control logic unit updates the result memory unit after a new test result has been supplied, the result memory unit being able to be read after the read signal has been supplied to the control logic unit.

In line with yet another preferred development of the present invention, the combinational logic device has an output data line for outputting the result data to the addressing and control unit, the output data line advantageously being disposed on the chip on which the circuit under test, the test device and the combinational logic device are disposed. The inventive circuit configuration is thus an extension of a circuit that is under test, such that no additional terminal unit in the test device is required for external connections when the circuit under test is being tested.

In line with yet another preferred development of the present invention, the combinational logic device has a read signal line for supplying read signals to the control logic unit in the combinational logic device. It being advantageous that the read signal line is likewise located on the chip on which the circuit under test, the test device and the combinational logic device are located. A connection between the circuit under test and the test device is provided by a test data line containing four, eight or sixteen individual lines.

Advantageously, the circuit under test, the test device and the combinational logic device are disposed on a single chip. In line with one preferred development of the present invention, the result data line for sequentially outputting the test results obtained using the test procedures contains a single individual line, with the result data line being used to supply a test result obtained from the test device to the combinational logic device.

In line with yet another preferred development of the present invention, the result memory unit is in the form of a single-bit memory, the sequentially obtained test results being stored in the result memory unit in the combinational logic device as a single-bit information item.

Other features which are considered as characteristic for the invention are set forth in the appended claims.

Although the invention is illustrated and described herein as embodied in a method for testing a circuit which is under test, and a circuit configuration for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
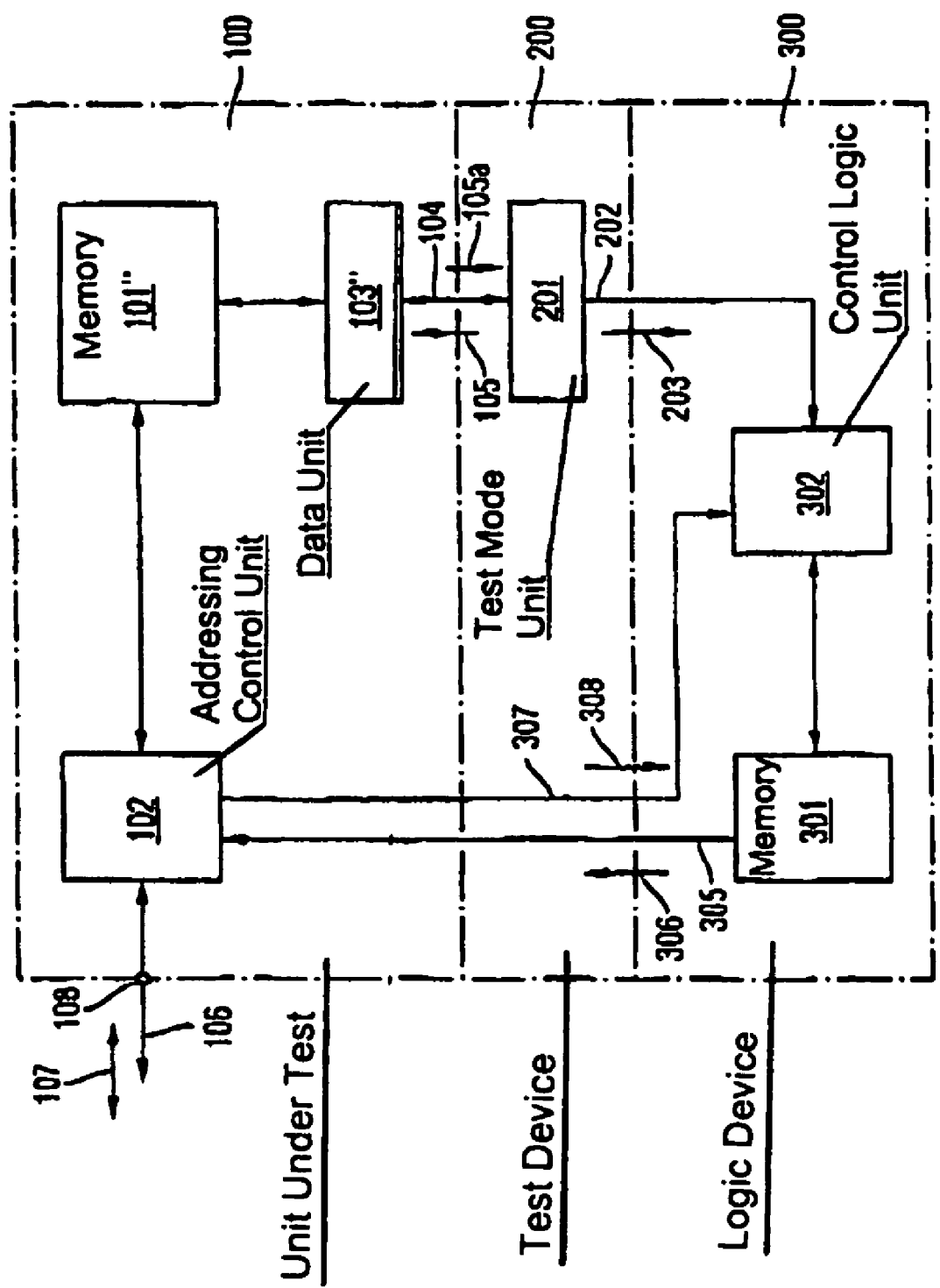
FIG. 1 is a block diagram of a circuit configuration for testing circuits under test in line with a preferred exemplary embodiment according to the invention.
Figure 2:
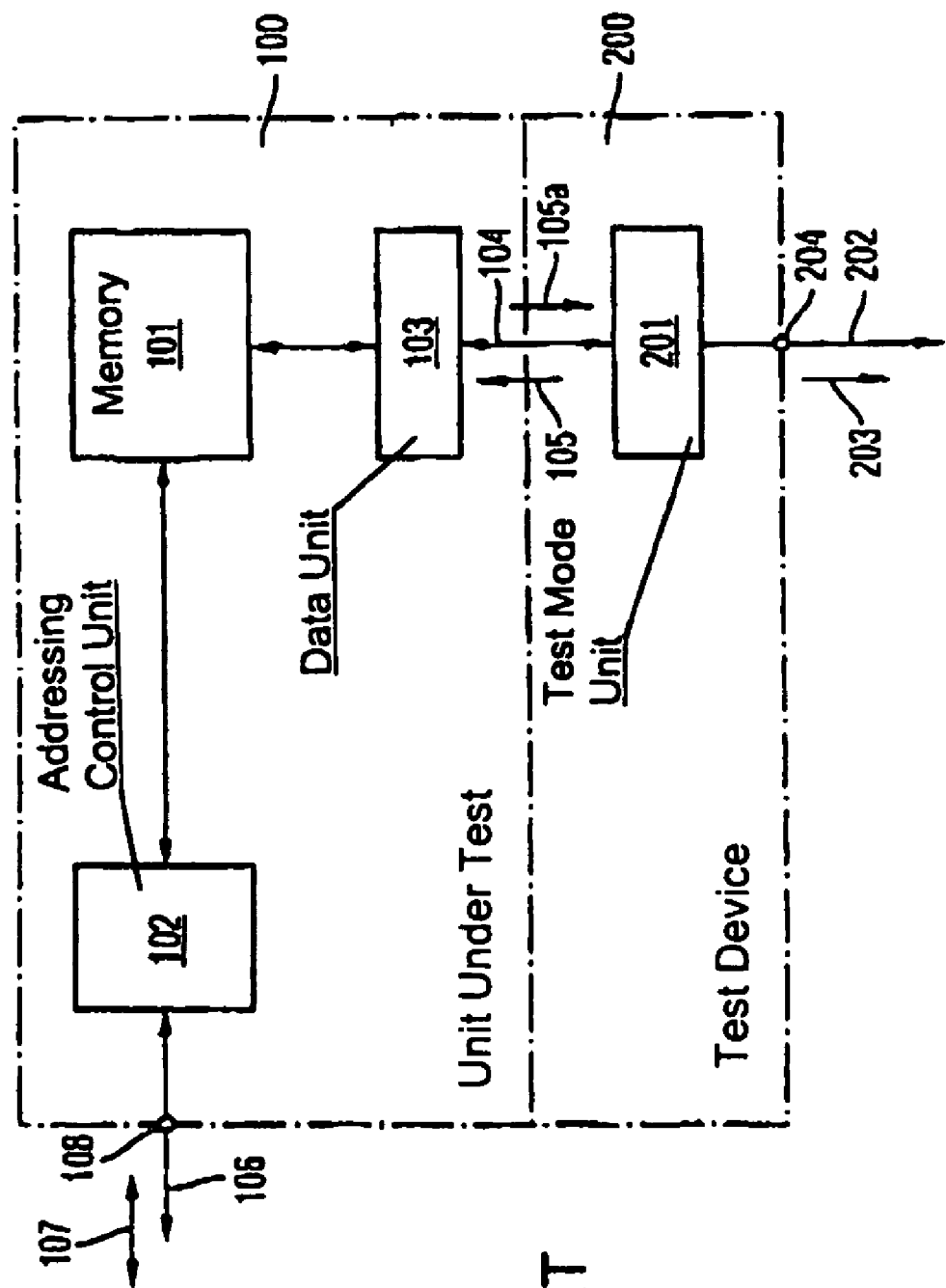
FIG. 2 is a block diagram of a conventional circuit configuration for testing circuits.

In all the figures of the drawing, sub-features and integral parts that correspond to one another bear the same reference symbol in each case. Referring now to the figures of the drawing in detail and first, particularly, to FIG. 1 thereof, there is shown a circuit configuration having a circuit 100 under test, a test device 200 and a combinational logic device 300. It will be pointed out that the circuit 100 under test, the test device 200 and the combinational logic device 300 in the exemplary embodiment described below are disposed on a single circuit chip and form a single circuit unit.

That is to say, the circuit 100 under test is extended both by the test device 200 and by the combinational logic device 300, and requires just one addressing and control terminal 108 as an external connection.

It will be pointed out that although the circuit 100 under test, the test device 200 and the combinational logic device 300 are shown as being disposed on a single chip, the circuit 100 under test, the test device 200 and the combinational logic device 300 may also be configured as separate circuit units.

The circuit 100 under test contains at least one memory cell array 101, which can be tested using supplied test data 105, at least one addressing and control unit 102 and a data unit 103. The data unit 103 is connected to the memory cell array 101 by a data line. The memory cell array 101 is controlled by the addressing and control unit 102, i.e. addresses and commands or instructions are supplied, as is known to a person skilled in the art. Such addressing and control data 107 are supplied to the circuit 100 under test via an addressing and control line 106 or are interchanged with the addressing and control unit 102 via the addressing and control line 106.

For this purpose, the overall circuit configuration, particularly the circuit 100 under test, contains an addressing and control terminal 108. All data communication with external circuits takes place via this single addressing and control terminal 108.

A test data line 104 connects the data unit 103 or the at least one memory cell array 101 in the circuit 100 under test to the test device 200. The test device 200 basically has a test mode unit 201 for producing the test data 105 which are supplied to the circuit 101 under test via the test data line 104.

In this way, test procedures can be performed sequentially in line with the prescribed test mode, the test procedures involving actual data 105a which are output by the circuit 100 under test on the basis of the test data 105 and which are transmitted from the circuit 100 under test to the test device 200 via the test data line 104 and are compared with prescribed nominal data in the test mode unit 201. The comparison between the actual data 105a supplied and the nominal data then determines whether the circuit 100 under test is fault-free or faulty.

A corresponding test result 203 is output onto a result data line 202 by the test mode unit 201.

In line with the invention, the test result 203 is now not output via a separate terminal of the test device, as in the case of the conventional circuit configuration, but rather is processed further in the combinational logic device 300 provided on the chip. The result data line 202 is used to supply the test result 203 to a control logic unit 302 contained in the combinational logic device 300. The control logic unit 302 is connected to a result memory unit 301, which is likewise contained in the combinational logic device 330.

In addition, the control logic unit 302 is supplied with a read signal 308 by the addressing and control unit 102 in the circuit 100 under test via a read signal line 307. Advantageously, the read signal line 307 is located on the circuit configuration chip, and therefore no external terminal units in the test device are necessary. A logic function in the combinational logic device 300 is performed such that an overall result is not changed if the circuit 100 under test is identified as error-free.

If, during a test procedure, the circuit 100 under test is identified as faulty, then the overall result is set to "faulty" and is not changed again, even when subsequent correct test procedures are provided, i.e. result data 306 which are output by the combinational logic device 300 indicate correct operation of the circuit 100 under test only if the actual data 105a which are output match the prescribed nominal data in all of the sequentially performed test procedures.

The overall result stored in the result memory unit 301 is output to the addressing and control unit 102 in the circuit 100 under test via an output data line 305. In this way, it is possible to follow performance of different test procedures by outputting a test result or result data 306 using the addressing and control unit 102 and also the addressing and control line 106 and the single addressing and control terminal 108 provided. This achieves the advantage that no additional terminal is required for outputting result data.

In order to initiate reading of the result memory unit 301, the control logic unit 302 is supplied with the read signal 308 via the read signal line 307. Advantageously, both the output data line 305 and the read signal line 307 are located on the overall circuit configuration chip, therefore no additional terminals for connecting external circuit units are required. In line with one preferred exemplary embodiment of the present invention, the result memory unit 301 is in the form of a single-bit memory.

The result memory unit 301 is thus used to store merely the current overall result. Whenever data are read again, a data comparison is performed internally and the result that would conventionally need to be output via a terminal unit in the test device the current test result is logically combined with the overall result which in the result memory unit 301, which is in the form of a single-bit memory. Specifically, such a logic function is performed as follows:

(i) the test procedure results in fault free operation of the circuit under test: the overall result remains set to "fault free operation"; and (ii) the test procedure results in a faulty operation of the circuit under test: the overall result is set to "faulty operation" and remains set to "faulty operation" even when further test procedures are performed.

A circuit 100 which is under test is tested by a sequence of write and read commands, and ultimately the only crucial matter is whether all of the result data are identified as "fault free" during reading. If "faulty operation" is ever established, the overall result is "faulty" in all cases.

For this reason, it is sufficient to read the result memory unit 301 for storing an overall result as a single-bit memory. When the last test procedure has been read, the overall result represented by the result data 306 is output via the addressing and control line 106 using a test mode.

In this context, the control logic unit 302 ensures that the result memory unit 301 is updated upon every read command supplied by the read signal 308. In addition, the control logic unit 302 has the function of providing the overall result to be read via the addressing and control line 106.

Although the present invention has been described above with reference to preferred exemplary embodiments, it is not limited thereto but rather can be modified in a wide variety of ways.

The invention is also not limited to the application options cited.

This application claims the priority, under 35 U.S.C. § 119, of German patent application No. 103 31 543.8, filed Jul. 11, 2003; the entire disclosure of the prior application is herewith incorporated by reference.

I claim:

1. A circuit configuration for testing a circuit, the circuit having at least one memory cell array and at least one addressing and control unit, the circuit configuration comprising:
   a test data line connected to the circuit under test;
   a test device for providing a test mode and connected to said test data line, said test device having a test mode unit for producing test data supplied to the circuit under test through said test data line, said test device performing test procedures sequentially, the test procedures involving actual data output by the circuit under test on a basis of the test data and the actual data being compared with prescribed nominal data in said test mode unit;
   a result data line for sequentially outputting test results obtained using the test procedures on a basis of the comparison; and
   a combinational logic device for logically combining the test results output sequentially to produce an overall result data such that the overall result data indicates fault free operation of the circuit under test only if the actual data being output match the prescribed nominal data in all of the sequentially performed test procedures, the overall result data being output through an addressing and control line by the addressing and control unit of the circuit under test.

2. The circuit configuration according to claim 1, wherein said combinational logic device has a result memory unit connected to said result data line and stores the overall result data and logically combines current test results obtained sequentially with the overall result data.

3. The circuit configuration according to claim 2, wherein said combinational logic device has a control logic unit for updating said result memory unit and is connected to said result memory unit.

4. The circuit configuration according to claim 2, wherein said result memory unit is a single-bit memory.

5. The circuit configuration according to claim 1, wherein said combinational logic device has an output data line connected to and outputting the overall result data to the addressing and control unit.

6. The circuit configuration according to claim 3, wherein said combinational logic device has a read signal line connected to and supplying a read signal to said control logic unit.

7. The circuit configuration according to claim 1, wherein said test data line contains 4, 8 or 16 individual lines.

8. The circuit configuration according to claim 1, further comprising a single chip and the circuit under test, said test device and said combinational logic device are disposed on said single chip.

9. The circuit configuration according to claim 1, wherein said result data line for sequentially outputting the test results obtained using the test procedures contains a single individual line.

10. A method for testing a circuit having at least one memory cell array and at least one addressing and control unit, which comprises the steps of:
    initiating a test mode using a test device;
    producing test data in a test mode unit in the test device;
    supplying the test data from the test device to the circuit under test through a test data line;
    performing test procedures sequentially, the test procedures involving actual data being output by the circuit under test on a basis of the test data and the actual data being compared with prescribed nominal data in the test mode unit;
    obtaining test results using the test procedures on a basis of the comparison;
    outputting sequentially the test results through a result data line;
    logically combining the test results resulting in an overall result data using a combinational logic device such that the overall result data indicates fault free operation of the circuit under test only if the actual data output match the prescribed nominal data in all of the sequentially performed test procedures; and
    outputting the overall result data through the addressing and control line of the addressing and control unit of the circuit under test.

11. The method according to claim 10, which further comprises:
    continuously logically combining current test results with the overall result data for updating the overall result data; and
    storing the overall result data in the result memory unit.

12. The method according to claim 11, which further comprises updating the result memory unit using a control logic unit in the combinational logic device.

13. The method according to claim 11, which further comprises storing the overall result data sequentially obtained in the result memory unit in the combinational logic device as a single-bit information item.

14. The method according to claim 10, which further comprises outputting the overall result data to the addressing and control unit through an output data line connected to the combinational logic device.

15. The method according to claim 12, which further comprises supplying the control logic unit in the combinational logic device with a read signal through a read signal line connected to the combinational logic device.

* * * * *